United States Patent
Takeuchi

(10) Patent No.: US 7,489,010 B2
(45) Date of Patent: Feb. 10, 2009

(54) SEMICONDUCTOR MEMORY DEVICE

(75) Inventor: Ken Takeuchi, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 187 days.

(21) Appl. No.: 11/409,043

(22) Filed: Apr. 24, 2006

(65) Prior Publication Data

US 2006/0268612 A1 Nov. 30, 2006

(30) Foreign Application Priority Data

May 27, 2005 (JP) ............................. 2005-155387

(51) Int. Cl.
 H01L 27/088 (2006.01)
 H01L 23/48 (2006.01)
 H01L 23/52 (2006.01)
 H01L 29/40 (2006.01)
(52) U.S. Cl. ...................... 257/401; 257/316; 257/390; 257/758
(58) Field of Classification Search ......... 257/314–316, 257/390, 401, 758; 365/185.17, 185.05, 365/63, 51, 185.11
See application file for complete search history.

(56) References Cited

U.S. PATENT DOCUMENTS

| 6,240,012 | B1 | 5/2001 | Nakamura et al. |
| 6,424,588 | B2 | 7/2002 | Nakamura et al. |
| 6,611,447 | B2 | 8/2003 | Nakamura et al. |
| 6,836,444 | B2 | 12/2004 | Nakamura et al. |
| 2002/0114191 | A1* | 8/2002 | Iwata et al. ............ 365/185.23 |

FOREIGN PATENT DOCUMENTS

JP 2001-308206 11/2001

OTHER PUBLICATIONS

U.S. Appl. No. 11/235,206, filed Sep. 27, 2005, Yasushi Kameda, et al.

* cited by examiner

*Primary Examiner*—Richard Elms
*Assistant Examiner*—Allison P Bernstein
(74) *Attorney, Agent, or Firm*—Oblon, Spivak, McClelland, Maier & Neustadt, P.C.

(57) ABSTRACT

In a semiconductor memory device with NAND cell units arranged, two first select gate lines in adjacent blocks sandwiching a bit line contact are formed to have first connection portions disposed at a certain pitch, where the two first select gate lines are connected to each other; two second select gate lines in adjacent blocks sandwiching a source line contact are formed to have second connection portions disposed at substantially the same pitch as the first connection portions, where the two second select gate lines are connected to each other; and the first and second shunt wirings are contacted with the first and second select gate lines at the first and second connection portions, respectively.

20 Claims, 18 Drawing Sheets

SEMICONDUCTOR MEMORY DEVICE

CROSS-REFERENCE TO RELATED APPLICATION

This application is based on and claims the benefit of priority from the prior Japanese Patent Application No. 2005-155387, filed on May 27, 2005, the entire contents of which are incorporated herein by reference.

BACKGROUND OF THE INVENTION

1. Field of the Invention

This invention relates to a semiconductor memory device, and specifically relates to a non-volatile semiconductor memory (EEPROM) having a cell array with NAND cell units arranged therein.

2. Description of the Related Art

A NAND-type flash memory is known as one of EEPROMs. A NAND-type flash memory is formed of NAND cell units, in each of which plural memory cells are connected in series in such a way that adjacent two memory cells share a source/drain diffusion layer. Disposed at both ends of each NAND cell unit are first and second select gate transistors for selectively coupling the NAND cell unit to a bit line and a source line, respectively.

A memory cell in the NAND cell unit is a MOS transistor with a floating gate serves as a charge storage layer and a control gate stacked thereabove. Control gates of memory cells are patterned to be a word line, which is continued in one direction. The gates of the first and second select gate transistors are patterned to be a first and second select gate line, which are disposed in parallel with the word line.

Each bit line is formed to be continued as crossing the word lines and contacted with the drain diffusion layer of the first select gate transistor. The source side of the NAND cell unit (i.e. the source diffusion layer of the second select gate transistor) is coupled to a common source line.

A set of NAND cell units sharing a word line constitutes a "block", which usually serves as a unit of data erase. Usually, plural blocks are arranged in the bit line direction to share a bit line. In this case, plural blocks are arranged in such a manner that first and second blocks disposed adjacent to each other share bit line contacts, and second and third blocks disposed adjacent to each other share a source line contacts. In other words, adjacent two first select gate lines in the adjacent two blocks sandwiching the bit line contacts are disposed adjacent to each other while adjacent two second select gate lines in the adjacent two blocks sandwiching the source line contacts are disposed adjacent to each other.

As the miniaturization and high integration of the cell array are advanced more; and the word line made longer and narrower, the word line delay becomes larger. To achieve a high speed performance in spite of the word line delay, it is desired to make the first and second select gate lines sufficiently low resistive, and use such a scheme that an on-drive timing of either one of them serves as a reference timing for data sensing. Word line charge-up starting prior to the reference timing, the influence of the word line delay will be removed.

To achieve the above-described read timing control, it is required of the first and second select gate lines with the same stacked polysilicon films as the word line to be made low resistive. For this purpose, two methods will be used as follows: one is to make the width of the select gate lines larger than the word line; and the other is to form shunt wirings, which are formed of a metal film, for backing the first and second select gate lines.

As a shunt wiring structure used for the first and second select gate lines, there has been provided such a manner that shunt wirings of the first select gate lines on the bit line contact side (i.e., drain side) are formed to have a common connection portion serving as a shunt portion shared by adjacent blocks while shunt wirings of the second select gate lines on the source line contact side (i.e., source side) are formed independent of each other for adjacent blocks (refer to Unexamined Japanese Patent Application Publication No. 2001-308206).

The reason of that the shunt wiring structures of the first and second select gate lines are made different from each other is for certainly avoiding such a situation that unnecessary bit line currents are carried in non-selected blocks. That is, in case of such a specification that on/off of the second select gate line determines connection/disconnection between the bit line and the NAND cell unit, the second select gate lines in the adjacent blocks are formed as independent of each other, and these are controlled in potential independently of each other. As described above, the second select gate lines being formed independent of each other, even if adjacent two first gate lines are short-circuited, it will be avoided that unnecessary bit line currents flow in the non-selected block.

SUMMARY OF THE INVENTION

According to an aspect of the present invention, there is provided a semiconductor memory device including:

a semiconductor substrate;

a cell array formed on the semiconductor substrate with NAND cell units arranged therein, the NAND cell unit having plural non-volatile semiconductor memory cells connected in series and first and second select gate transistors disposed at both ends thereof, one block including a set of the NAND cell units arranged in a first direction, a plurality of the blocks being arranged in a second direction in such a manner that common drains of the first select gate transistors in adjacent blocks serve as bit line contacts while common sources of the second select gate transistors in the following adjacent blocks serve as source line contacts;

word lines formed as elongated in the first direction of the cell array, to which the control gates of a plurality of the memory cells arranged in the first direction are coupled in common;

first select gate lines formed as elongated in the first direction of the cell array, to which the gates of a plurality of the first select gate transistors arranged in the first direction are coupled in common;

second select gate lines formed as elongated in the first direction of the cell array, to which the gates of a plurality of the second select gate transistors arranged in the first direction are coupled in common; and first and second shunt wirings formed above the first and second select gate lines, respectively, wherein two first select gate lines in adjacent blocks sandwiching the bit line contacts are formed to have first connection portions disposed at a certain pitch, the two first select gate lines being connected to each other at the first connection portions;

two second select gate lines in adjacent blocks sandwiching the source line contacts are formed to have second connection portions disposed at substantially the same pitch as the first connection portions, the two second select gate lines being connected to each other at the second connection portions; and the first and second shunt wirings are contacted with the first and second select gate lines at the first and second connection portions, respectively.

According to another aspect of the present invention, there is provided a semiconductor memory device including:

a semiconductor substrate;

a cell array formed on the substrate with NAND cell units arranged therein, the NAND cell unit having plural non-volatile semiconductor memory cells connected in series and first and second select gate transistors disposed at both ends thereof, the cell array including at least three, first, second and third blocks arranged in a first direction, each block including a set of the NAND cell units arranged in a second direction;

bit lines formed to be continued in the first direction of the cell array and contacted with the common drains of the first select gate transistors in the first and second blocks at bit line contact portions disposed and arranged between the first and second blocks;

a common source line contacted with the common sources of the second select gate transistors in the second and third blocks at source contact portions disposed and arranged between the second and third blocks;

word lines formed to be continued in the second direction in the cell array, to which control gates of a plurality of the memory cells are coupled in common;

first select gate lines formed in parallel with the word lines in the cell array, to which the gates of a plurality of the first select gate transistors are coupled in common;

second select gate lines formed in parallel with the word lines in cell array, to which the gates of a plurality of the second select gate transistors are coupled in common;

first and second shunt wirings formed above the first and second select gate lines, respectively; and a well wiring formed to be continued in the first direction and contacted with the semiconductor substrate at a well wiring contact portion disposed in line with at least one of the bit line contact portions and the source line contact portions, wherein two of the first select gate lines, which are disposed adjacent to each other to sandwich the bit line contact portions, are formed to constitute a ladder pattern with first interconnection portions arranged at a first pitch;

two of the second select gate lines, which are disposed adjacent to each other to sandwich the source line contact portions, are formed to constitute another ladder pattern with second interconnection portions arranged at a second pitch; and the first and second shunt wirings are contacted with the first and second select gate lines at the first and second interconnection portions, respectively.

DETAILED DESCRIPTION OF THE EMBODIMENTS

Illustrative embodiments of this invention will be explained with reference to the accompanying drawings below.

Figure 1:
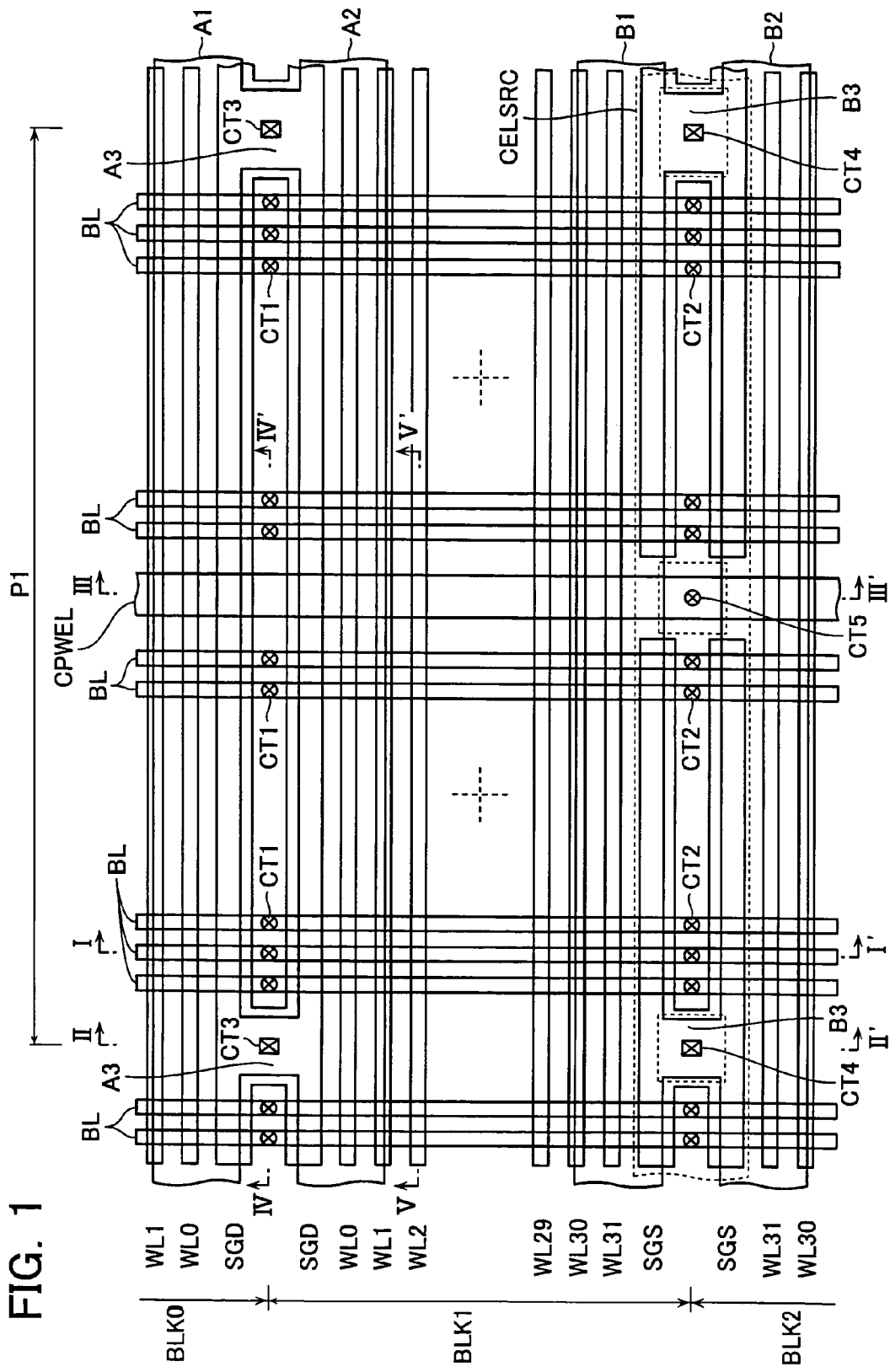
FIG. 1 shows the cell array layout of a NAND-type flash memory in accordance with a first embodiment.
Figure 2:
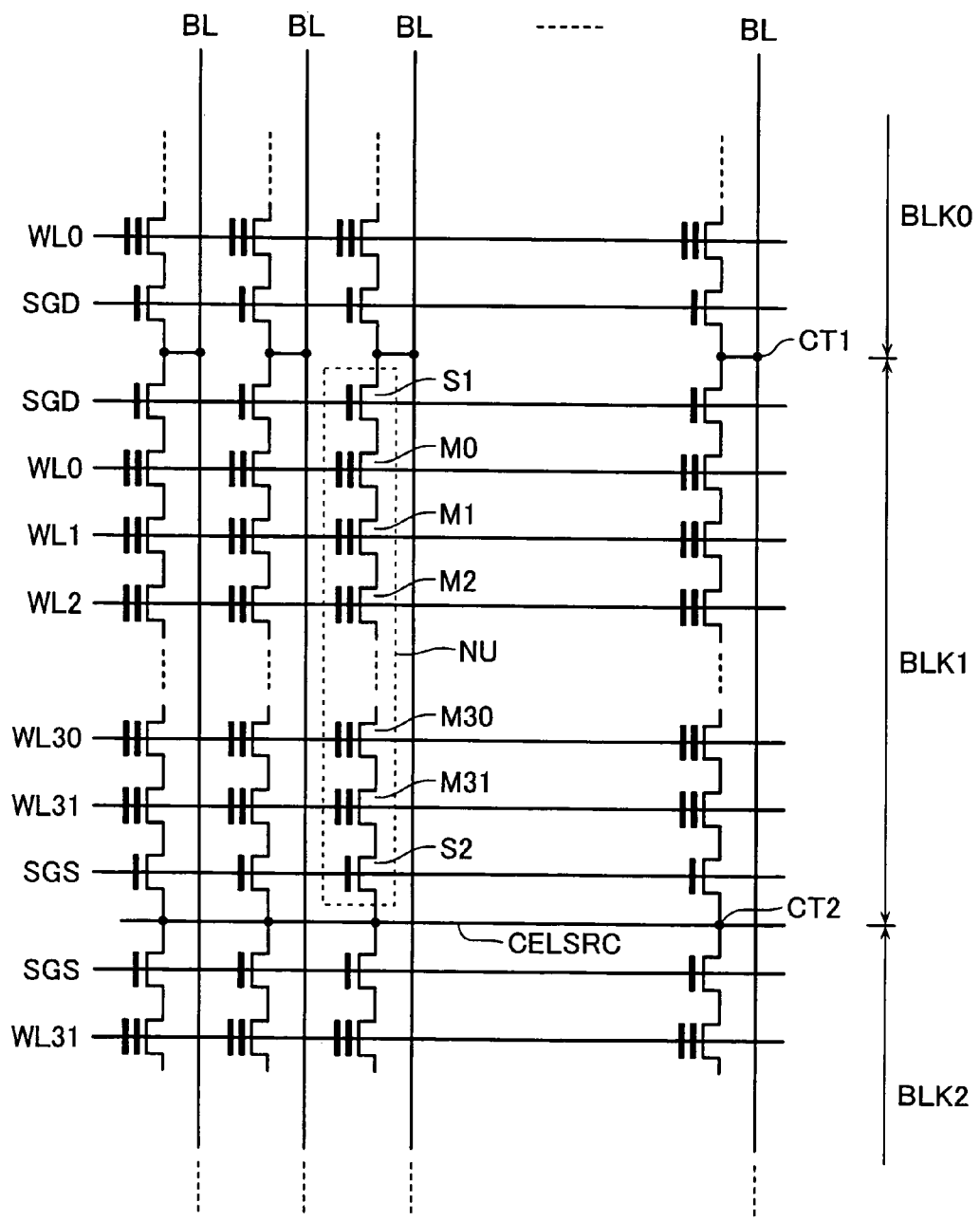
FIG. 2 shows an equivalent circuit of the cell array.

FIG. 1 shows a layout of a cell array of a NAND-type flash memory in accordance with an embodiment of the present invention, and FIG. 2 shows the equivalent circuit of the cell array. FIGS. 3, 4, 5, 6 and 7 show sectional views taken along lines I-I', II-II', III-III', IV-IV' and V-V', respectively, in FIG. 1.

The cell array is, as shown in FIG. 2, formed of NAND cell units arranged in a matrix manner. Each NAND cell unit has plural electrically rewritable and non-volatile memory cells M0-M31 connected in series and first and second select gate transistors S1 and S2 disposed for coupling both ends of the memory cell string to a bit line BL and a source line CELSRC, respectively.

Control gates of the memory cells in the NAND cell unit are coupled to different word lines WL0-WL31 formed as elongated in a first direction of the cell array, to each of which the control gates of memory cells arranged in the first direction are coupled in common. Gates of the first and second select gate transistors are coupled in common to first and second select gate lines SGD and SGS, respectively, disposed in parallel with the word lines. While each of the first and second select gate lines is, as described later, a gate wiring with a stacked structure of first and second polysilicon films serving as the floating gate and control gate of the memory cell, the wiring width is made sufficiently wider than the word line for the purpose of making the select gate transistor have a specifically good off-property.

A set of NAND cell units sharing word lines constitutes a "block", which serves as a unit of data erase. As shown in FIGS. 1 and 2, plural blocks BLK (BLK0, BLK1, BLK2, . . . ) are arranged in the direction of the bit line BL to share it. Bit line contact portions CT1, where bit lines are contacted with common drains of the first select gate transistors, are disposed between the first select gate lines SGD disposed in adjacent blocks BLK0 and BLK1 while source line contact portions CT2, where a source line CELSRC is contacted with the common source of the second select gate transistors, are disposed between the second select gate lines SGS disposed in adjacent blocks BLK1 and BLK2. That is, plural blocks are arranged in such a manner that each adjacent two blocks share bit line contacts CT1 and source line contacts CT2.

Two first select gate lines SGD, which are disposed adjacent to each other to sandwich the bit line contacts CT1, have connection portions (or interconnection portions) A3, to which the two first select gate lines SGD are connected to each other. The connection portions A3 serves for contacting shunt wirings A1 and A2 described later with the select gate lines SGD and disposed at a certain pitch P1 in the direction of the word line. That is, the two select gate lines SGD are formed to constitute a ladder pattern.

Similarly, two second select gate lines SGS, which are disposed adjacent to each other to sandwich the source line contacts CT2, have connection portions (or interconnection portions) B3, to which the two second select gate lines SGS are connected each other. The connection portions B3 serves for contacting shunt wirings B1 and B2 with the select gate lines SGS and disposed at the same pitch P1 as the connection portions A3. That is, the two select gate lines SGS are formed to constitute a ladder pattern.

Disposed above the first select gate lines SGD are metal wirings (i.e., shunt wirings) A1 and A2 formed to back the select gate lines SGD with such a width each as to extend over the word line(s). The shunt wirings A1 and A2 are short-circuited to each other at the connection portions A3, and shunt wiring contact portions CT3 disposed at the connection portions A3, at which the shunt wirings A1 and A2 are contacted with the select gate lines SGD.

Similarly, disposed above the second select gate lines SGS are metal wirings (i.e., shunt wirings) B1 and B2 formed to back the select gate lines SGS with such a width each as to extend over the word line(s). The shunt wirings B1 and B2 are short-circuited to each other at the connection portions B3, and shunt wiring contact portions CT4 disposed at the connection portions B3, at which the shunt wirings B1 and B2 are contacted with the select gate lines SGS.

As shown in FIG. 1, further disposed above the cell array is a well wiring CPWEL formed of a metal wiring to be contacted with the p-type well, on which the cell array is formed. The well wiring CPWEL is formed midway between the shunt wiring contacts CT3 (CT4) as continued in the direction of the bit line to have a well wiring contact CT5 in line with the source line contacts CT2.

The cell array structure will be explained further in detail with reference to sectional views shown in FIGS. 3 to 7.

p-type well 12, which is formed in the n-type well 11 formed on the p-type silicon substrate 10, serves as a cell array area. On the p-type well 12, stripe-shaped device forming areas 14 are formed as defined by an STI (Shallow Trench Isolation) film, i.e., a device isolation film, buried in the well 12. Floating gates 21 formed of a first polysilicon film are formed on each device formation with tunneling insulation films interposed therebetween. Further control gates 22 are formed above the floating gates, which are formed of a second polysilicon film stacked above the first polysilicon film with an inter-gate insulating film interposed therebetween.

The floating gates 21 are separated from each other for respective cells while the control gates 22 are formed as continued in one direction to constitute a word line WL. Performing ion implantation with word lines used as masks, source/drain diffusion layers 23 are formed, each of which is shared by adjacent memory cells. Silicon oxide film 24 is buried between the word lines, and the surface of the cell array is covered with silicon nitride film 25.

Select gate transistors S1 and S2, which are disposed at the both ends of the memory cell string of M0-M31, have basically the same structure as that of the memory cell, but the both of the first polysilicon films 21$d$ and 21$s$ and the second polysilicon films 22$d$ and 22$s$ are formed as continued, thereby constituting select gate lines SGD and SGS with the stacked polysilicon films. Each of the select gate lines 22$d$ (SGD) and 22$s$(SGS) is made wider than the word line 22(WL).

For example, the word lines are arranged at a pitch of 60 nm to 70 nm while the select gate lines SGD and SGS are formed with a width of 150 nm to 200 nm each and have a space of 100 nm to 150 nm between adjacent ones, which serves as a wiring contact portion.

Drain diffusion layer 23$d$ of the first select gate transistor S1 is a common drain diffusion layer shared by adjacent two blocks and serves as a bit line contact portion CT1. Source diffusion layer 23$s$ of the second select gate transistor S2 is a common source diffusion layer shared by adjacent two blocks and serves as a source line contact portion CT2.

Figure 4:
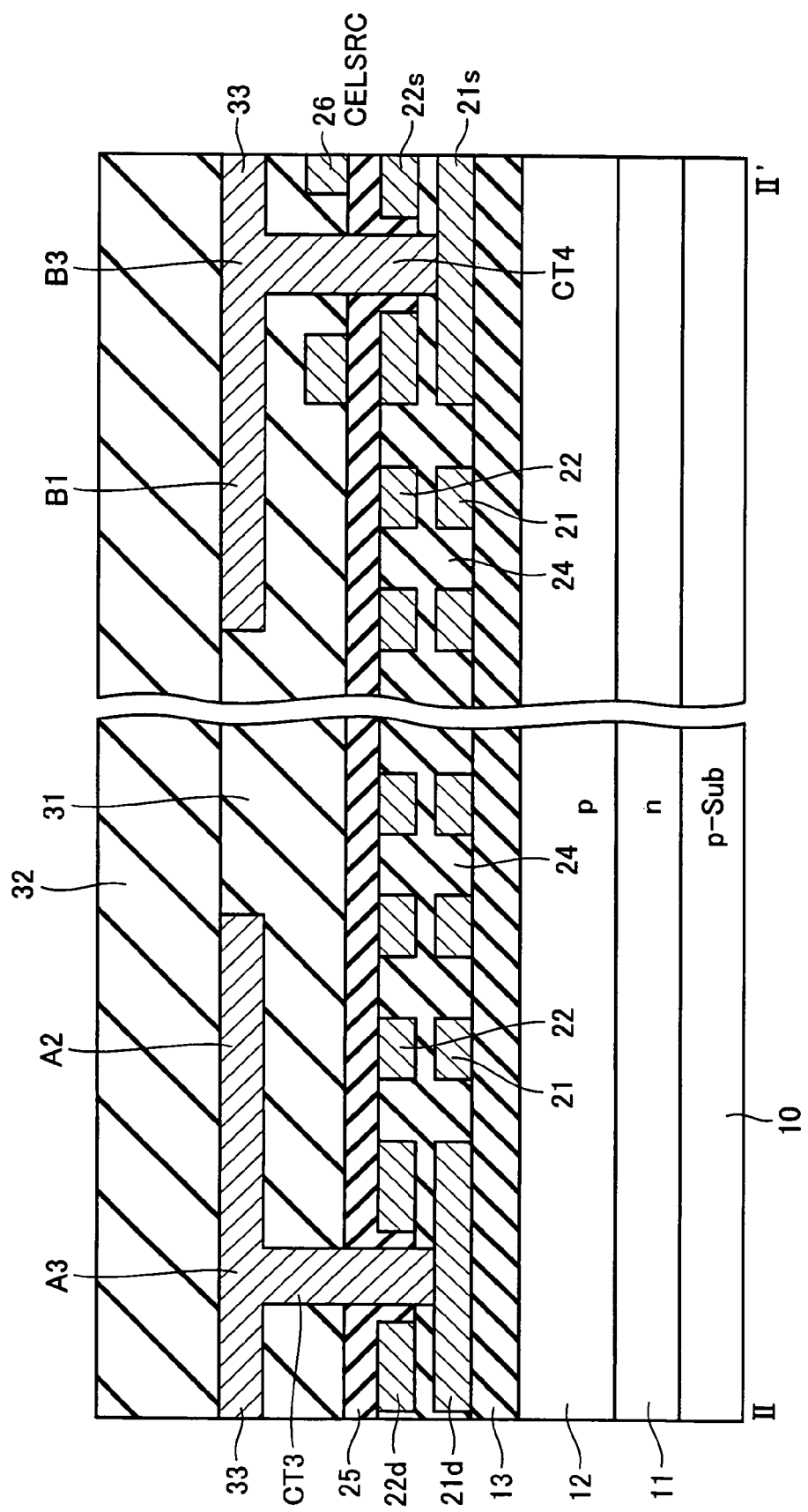
FIG. 4 shows a sectional view of the cell array taken along line II-II' in FIG. 1.
Figure 6:
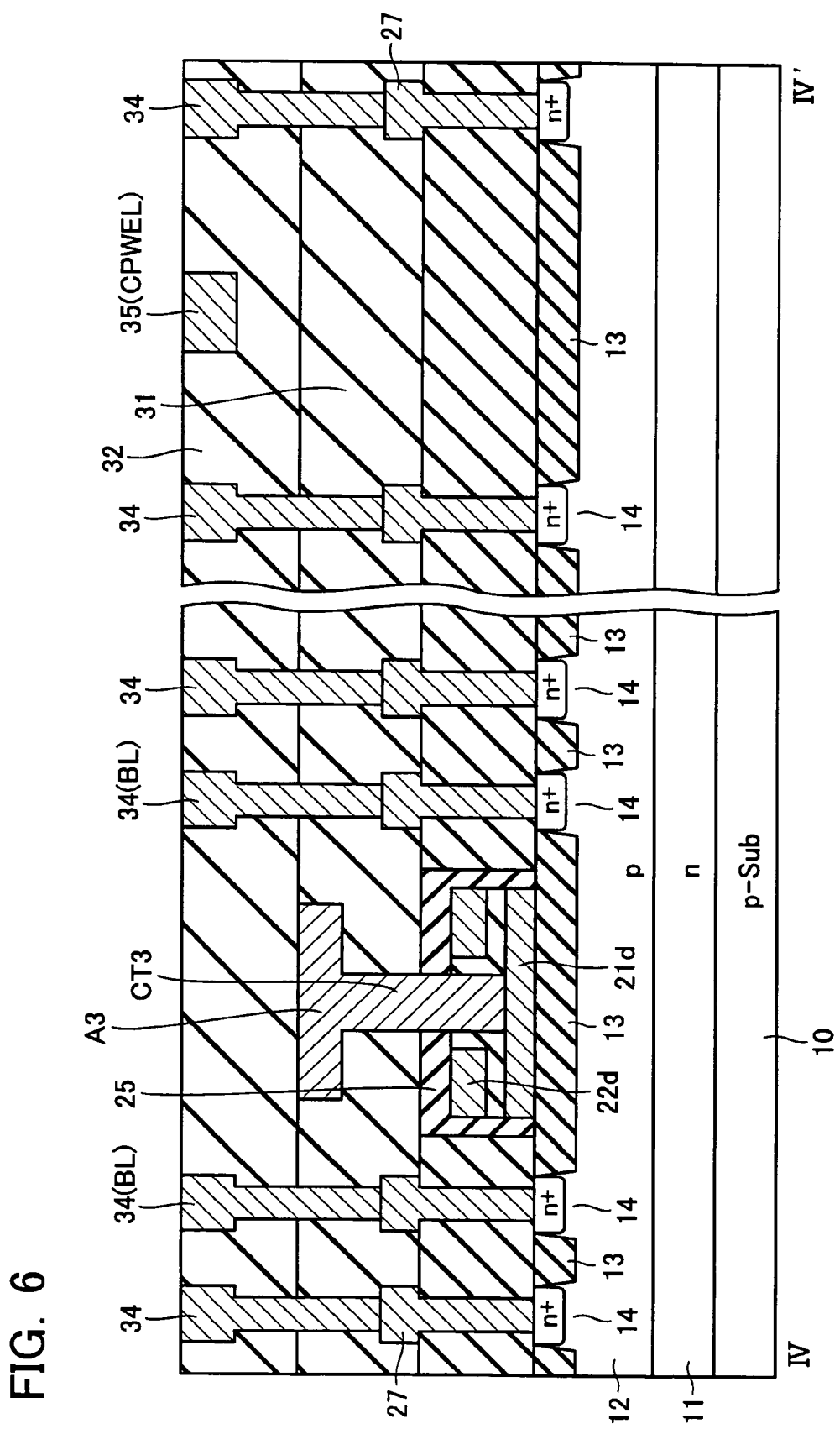
FIG. 6 shows a sectional view of the cell array taken along line IV-IV' in FIG. 1.
Figure 7:
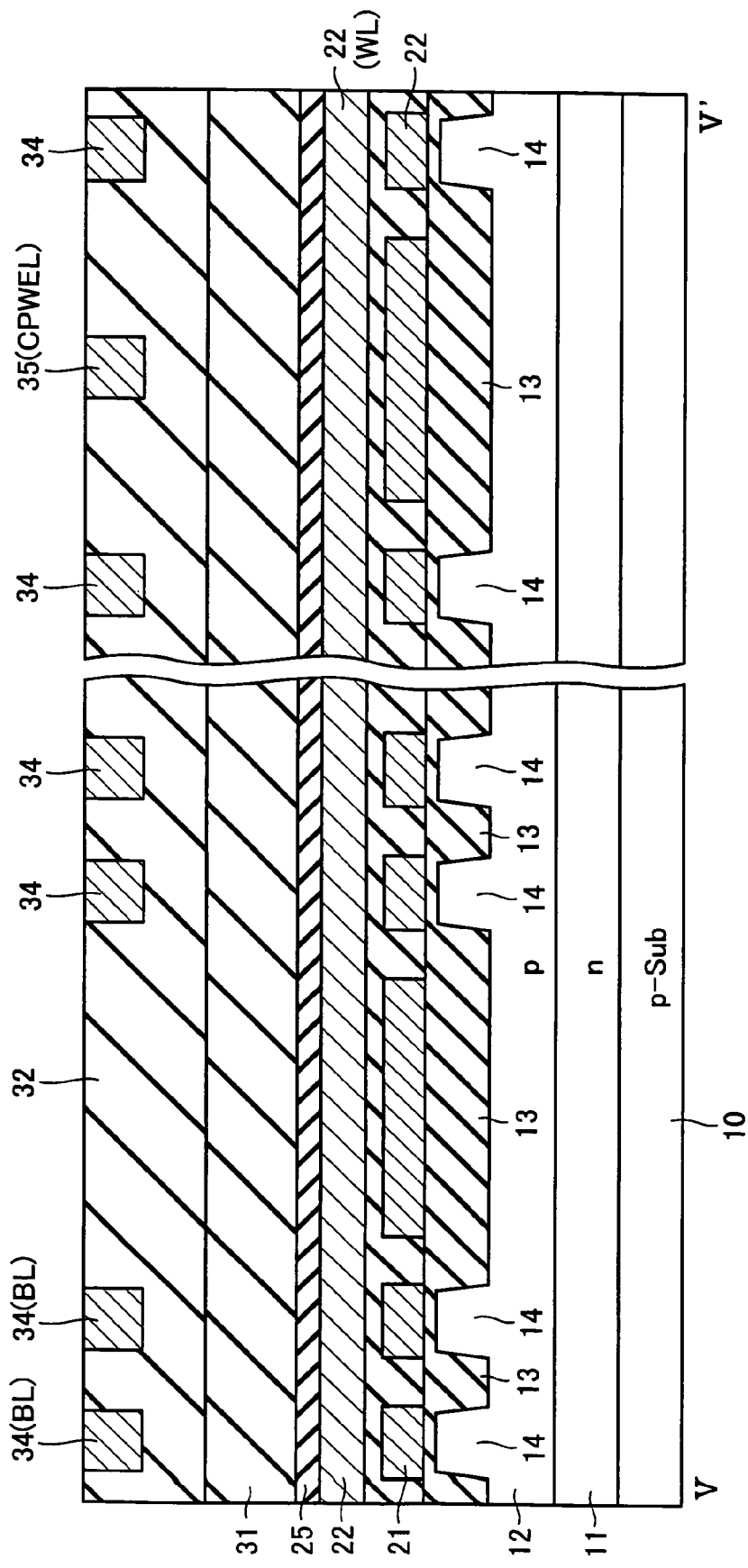
FIG. 7 shows a sectional view of the cell array taken along line V-V' in FIG. 1.

As shown in FIGS. 1, 4 and 6, adjacent two first select gate lines SGD disposed in adjacent blocks BLK0 and BLK1 have a common connection portion A3, which serves as a shunt wiring contact portion. As similar to this, adjacent two second select gate lines SGS disposed in adjacent blocks BLK1 and BLK2 have another common connection portion B3, which serves as another shunt wiring contact portion.

In the prior art, two first select gate lines SGD disposed on the bit line contact side (i.e., drain side) are formed with a pattern, in which there is a common connection portion, while two second select gate lines SGS disposed on the source line contact side (i.e., source side) are formed with separated patterns, which are independent of each other. By contrast, in this embodiment, the first and second select gate lines SGD and SGS are formed of the same pattern to have connection portions A3 and B3, respectively.

Formed on the above described cell array is a common source line (CELSRC) 26, which is formed of, for example, a polysilicon film to be contacted with the source diffusion layers 23$s$ of the second select gate transistors S2. The common source line 26 is, as shown by a dotted line in FIG. 1, formed as s buried wiring continued in the direction of the word line WL, which has openings at the shunt wiring contact portions CT3 and CT4 and well wiring contact portions CT5.

Figure 3:
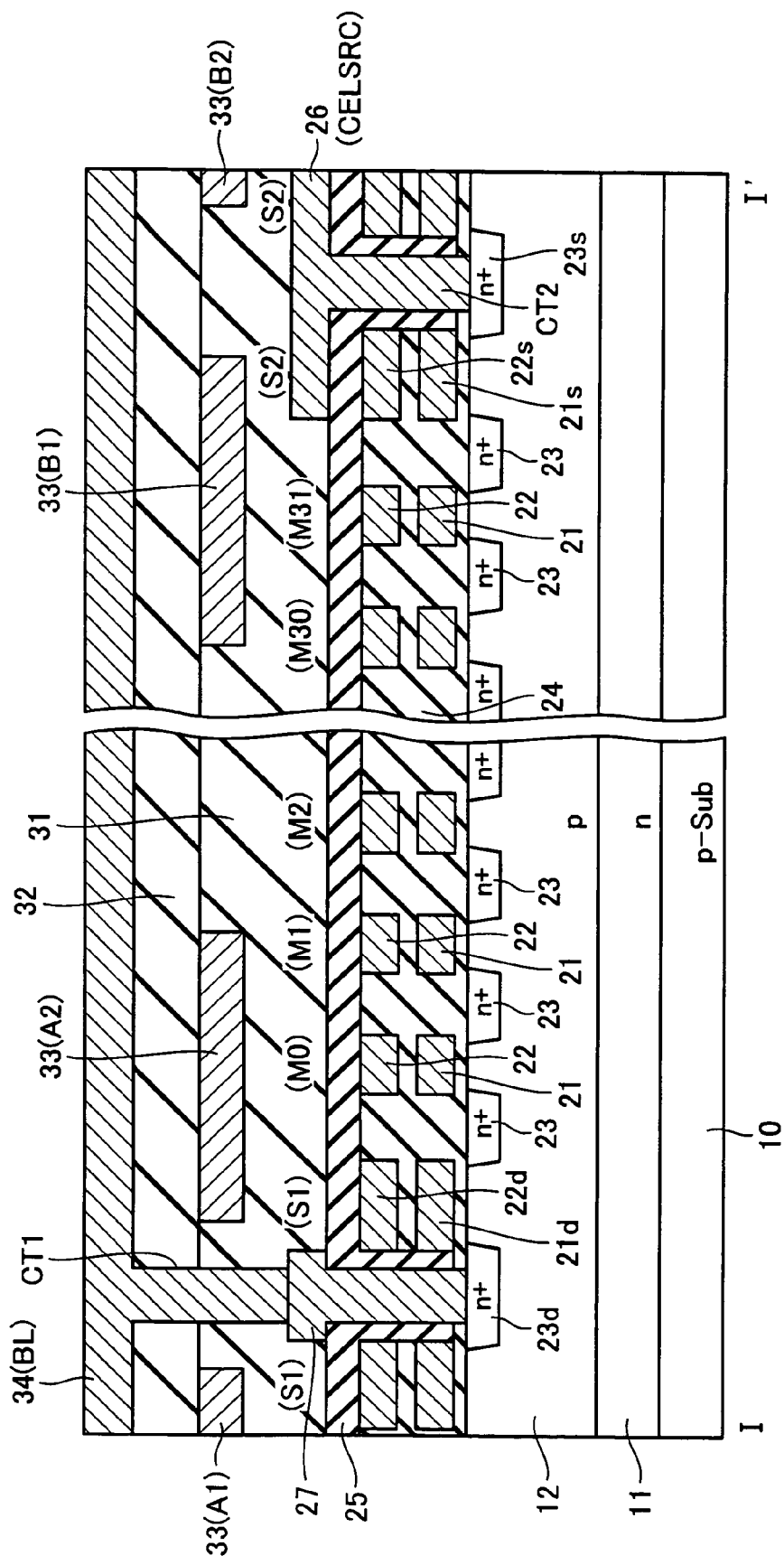
FIG. 3 shows a sectional view of the cell array taken along line I-I' in FIG. 1.

As shown in FIGS. 3 and 6, in this embodiment, bit line contact plugs 27 also are formed of the same buried polysilicon film as the source line 26.

After having formed the source line 26 and contact plugs 27, the cell array is covered with interlayer insulating film 31, on which shunt wirings (A1, A2, B1 and B2) 33 are formed as first metal wirings disposed above the select gate lines SGD and SGS. The shunt wirings are formed, for example, with a dual damascene method.

Both of these shunt wirings (A1, A2) and (B1, B2) have connection portions overlapped the connection portions A3 and B3 of the select gate lines SGD and SGS, respectively, and are contacted with the select gate lines SGD and SGS at these connection portions. As shown in FIG. 4 and 6, the contacts CT3 and CT4 of the shunt wirings (A1, A2) and (B1, B2) are contacted in detail with the first polysilicon films 21$d$ and 21$s$ of the select gate lines SGD and SGS, respectively.

After having formed the shunt wirings, the cell array is covered with another interlayer insulating film 32, on which bit lines (BL) 34 are formed as second metal wirings. These bit lines are also formed with such a damascene method that wiring grooves and contact holes are formed in the surface of the interlayer insulating film 32, and then a metal film is buried in them. Bit line contact CT1 is connected to the common drain layer 23d via contact plug 27.

In this embodiment, well wiring (CPWEL) 35, which is contacted with the p-type well, is formed of the same second metal film as the bit line 34. It should be noted that the well wiring may be formed of a different metal film from the bit line, for example, an upper layer metal deposited above the bit line (not shown).

Figure 5:
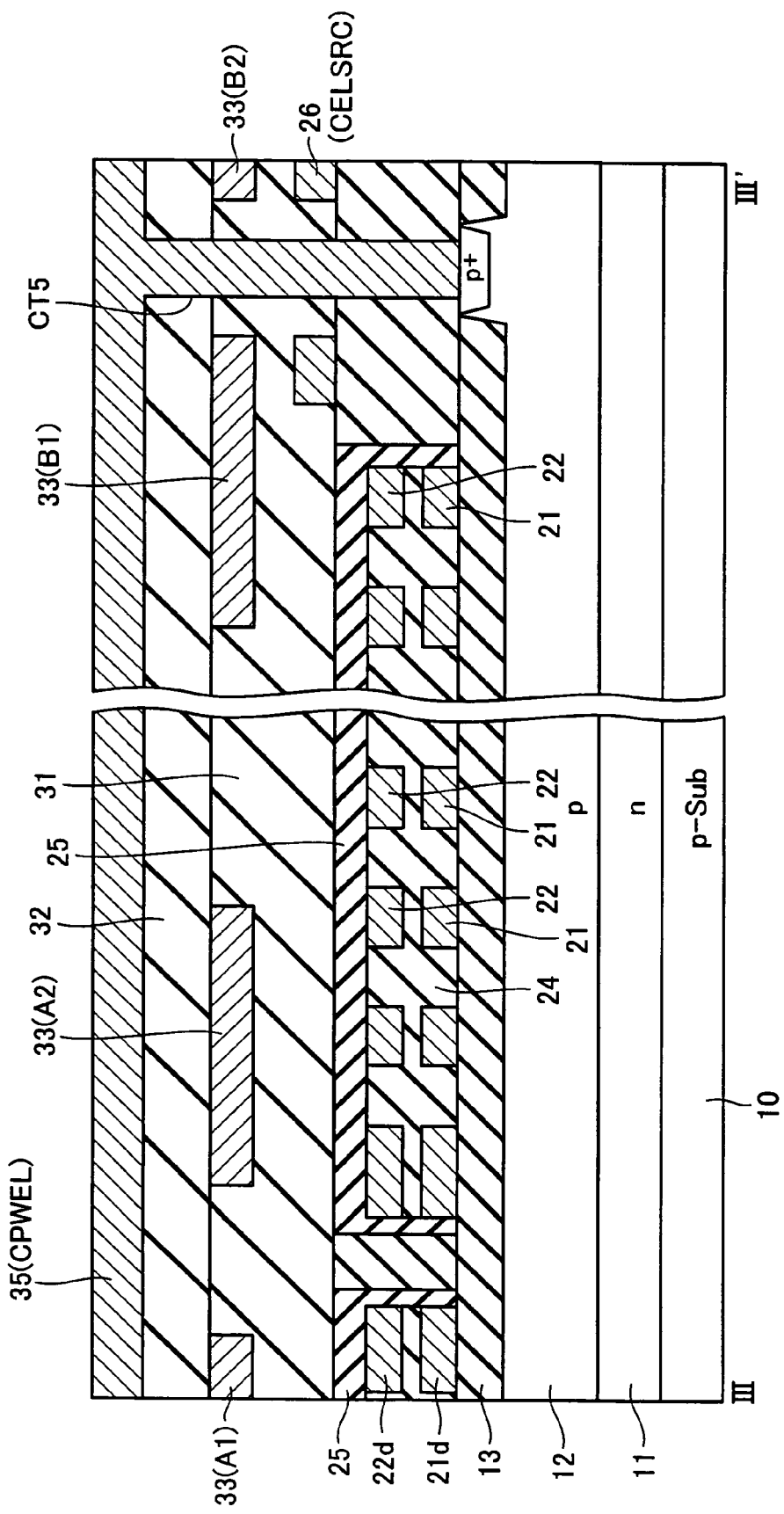
FIG. 5 shows a sectional view of the cell array taken along line III-III' in FIG. 1.

The well wiring 35 is located midway between the contact portions CT3 of the shunt wirings A1 and A2 and formed in parallel with the bit lines 34. As shown in FIG. 5, on the well wiring 35 in this embodiment, well wiring contact CT5, which is formed for contacting it with the p-type well, is disposed in line with the source line contacts CT2. To dispose the well wiring contact CT5 at this position, the second select gate line SGS is discontinued here.

As described above, both of the select gate lines SGD on the bit line side and the select gate lines SGS on the source line side are formed to have substantially the same ladder pattern. In the conventional case, source side select gate lines and shunt wirings thereof are formed independent of each other in the respective blocks. This is because that the shunt wiring of the select gate line is formed as to partially overlap the word lines. Another reason is as follows: if the shunt wiring is integrally formed for two adjacent blocks, there is a fear that when a voltage is applied to the select gate line in a selected block, unnecessary voltage is applied to the word line due to capacitive coupling from the shunt wiring in the non-selected block.

However, as a result of the recent development of the micro-fabrication technologies, the line/space of the word lines becomes smaller and smaller. As a result, the capacitive coupling to the word line from the upper wiring becomes relatively smaller. By contrast, lateral capacitive coupling between adjacent cells (i.e., capacitive coupling between adjacent floating gates) becomes largely problematic. As a result of the above-described situation change, it becomes not necessary to form the source side select gate lines of the adjacent blocks so as to be independent of each other and form the shunt wirings thereof so as to be independent of each other.

Considering the above-described situation, as substantially the same as the bit line side select gate lines, the source side select gate lines are formed in this embodiment to have an integrated pattern with connection portions, and shunt wirings thereof are also formed to have an integrated pattern so as to be contacted with the connection portions.

Further, in the conventional case, the contact of the well wiring CPWEL being aligned with the arrangement of the bit line contacts CT1, the drain side select gate lines should be separated from each other at the well wiring contact position. Therefore, supposing that the length between adjacent two shunt wiring contacts CT3 is P1, which corresponds to space of two hundred bit lines, it is in need of driving the select gate line with P1/2 in length corresponding to one hundred bit lines from only one contact CT3.

By contrast, the well wiring CPWEL in this embodiment is contacted with the p-type well in line with the source line contacts, and passed over the location of the bit line contact contacts. Therefore, the drain side select gate line SGD is formed as a continuous pattern without regard to the existence of the well wiring CPWEL. As a result, it is possible to drive the select gate line with P1 in length corresponding to two hundred bit lines from the both side contacts CT3. Therefore, the delay of the select gate line SGD becoming substantially less, it can be achieved a high speed drive performance.

Figure 8:
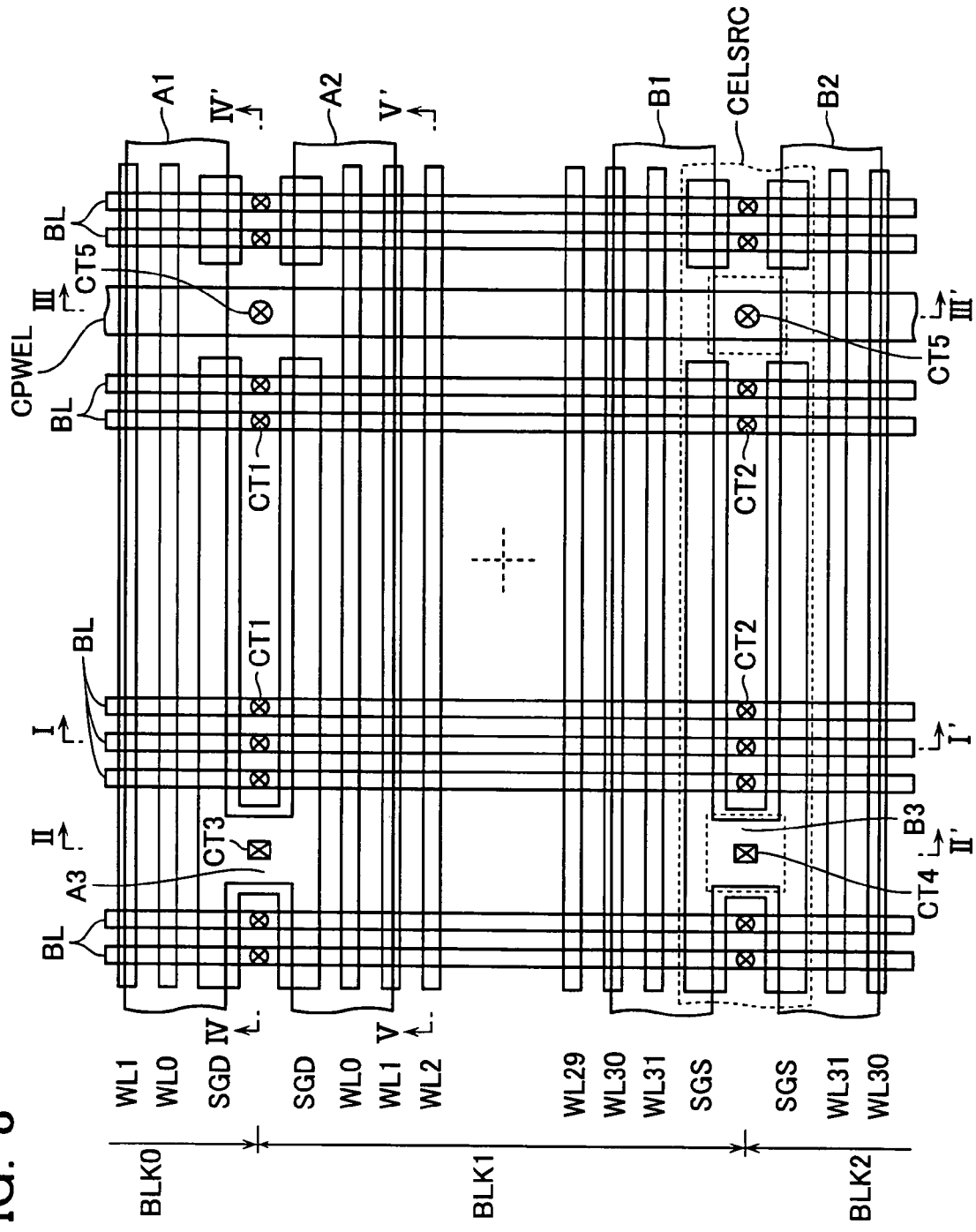
FIG. 8 shows the cell array layout of a NAND-type flash memory in accordance with a second embodiment.
Figure 9:
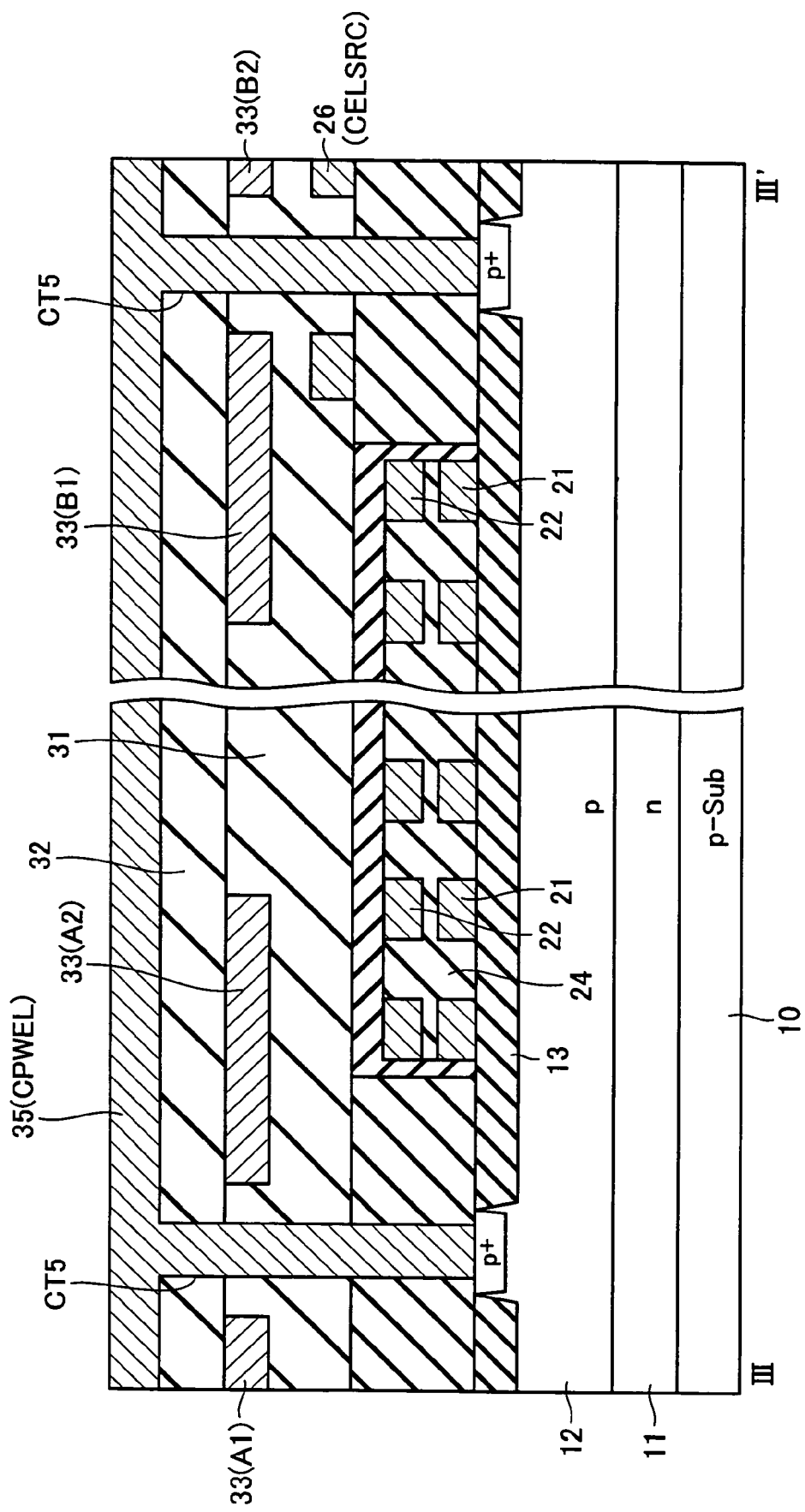
FIG. 9 shows a sectional view of the cell array taken along line III-III' in FIG. 8.
Figure 10:
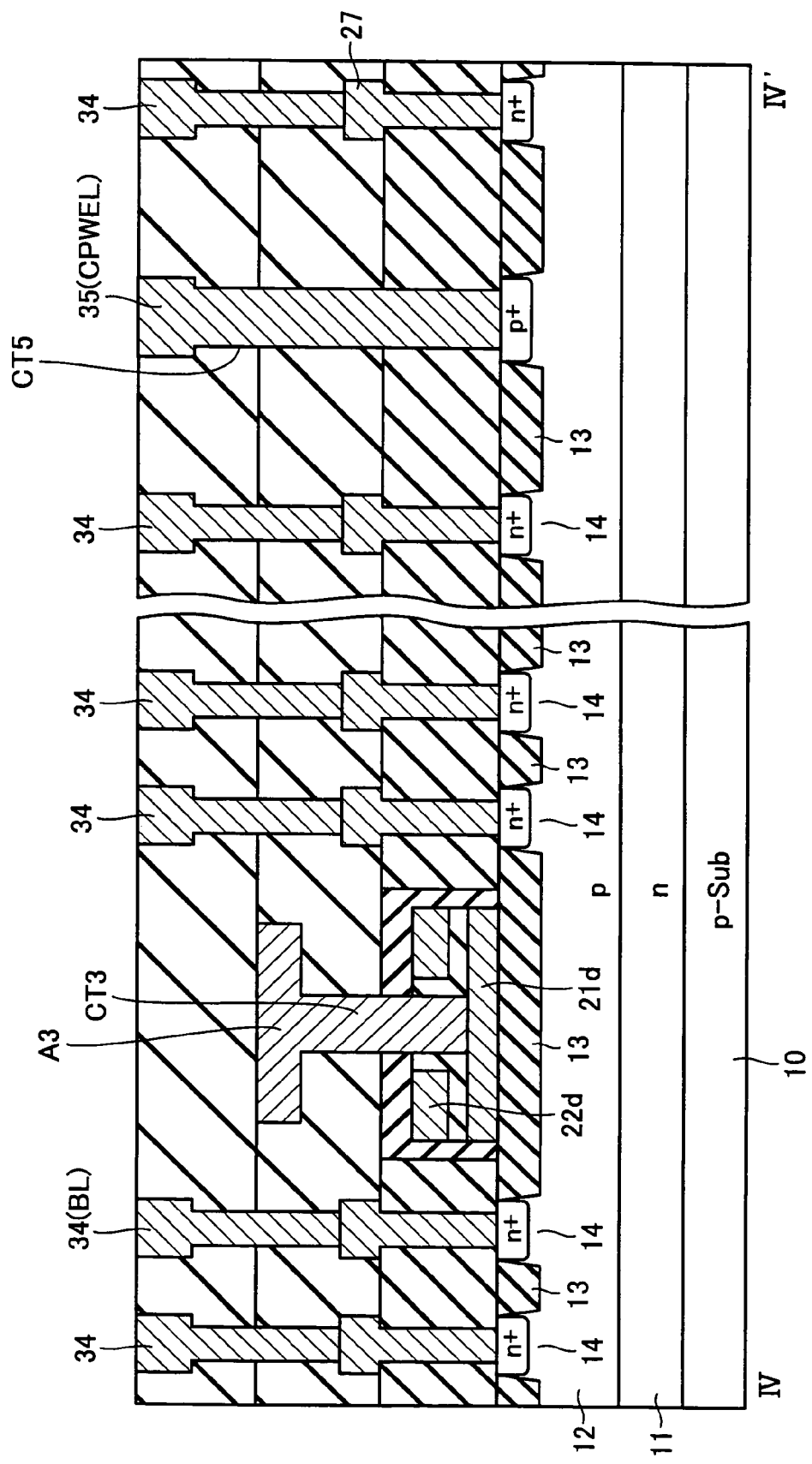
FIG. 10 shows a sectional view of the cell array taken along line IV-IV' in FIG. 8.

FIG. 8 shows a cell array layout of a NAND-type flash memory in accordance with a second embodiment. The same portions corresponding to those in the first embodiment are shown by the same reference signs, and detailed explanation thereof will be omitted. With respect to the sectional structures, III-III' and IV-IV' sectional views are shown in FIGS. 9 and 10, respectively, which show different sections from those in the first embodiment.

In this embodiment, the well wiring (CPEWL) 35 is contacted with the p-type well at not only a position where the source line contacts CT2 are arranged but also anther position where the bit line contacts CT1 are arranged. Therefore, the drain side select gate line SGD is discontinued at the well wiring contact CT5 portion.

According to this embodiment, the number of the well wiring contacts being increased, the wiring resistance and influences thereof will be reduced. In addition, the drain side select gate line SGD and the source side select gate line SGS are made have completely the same pattern.

Figure 11:
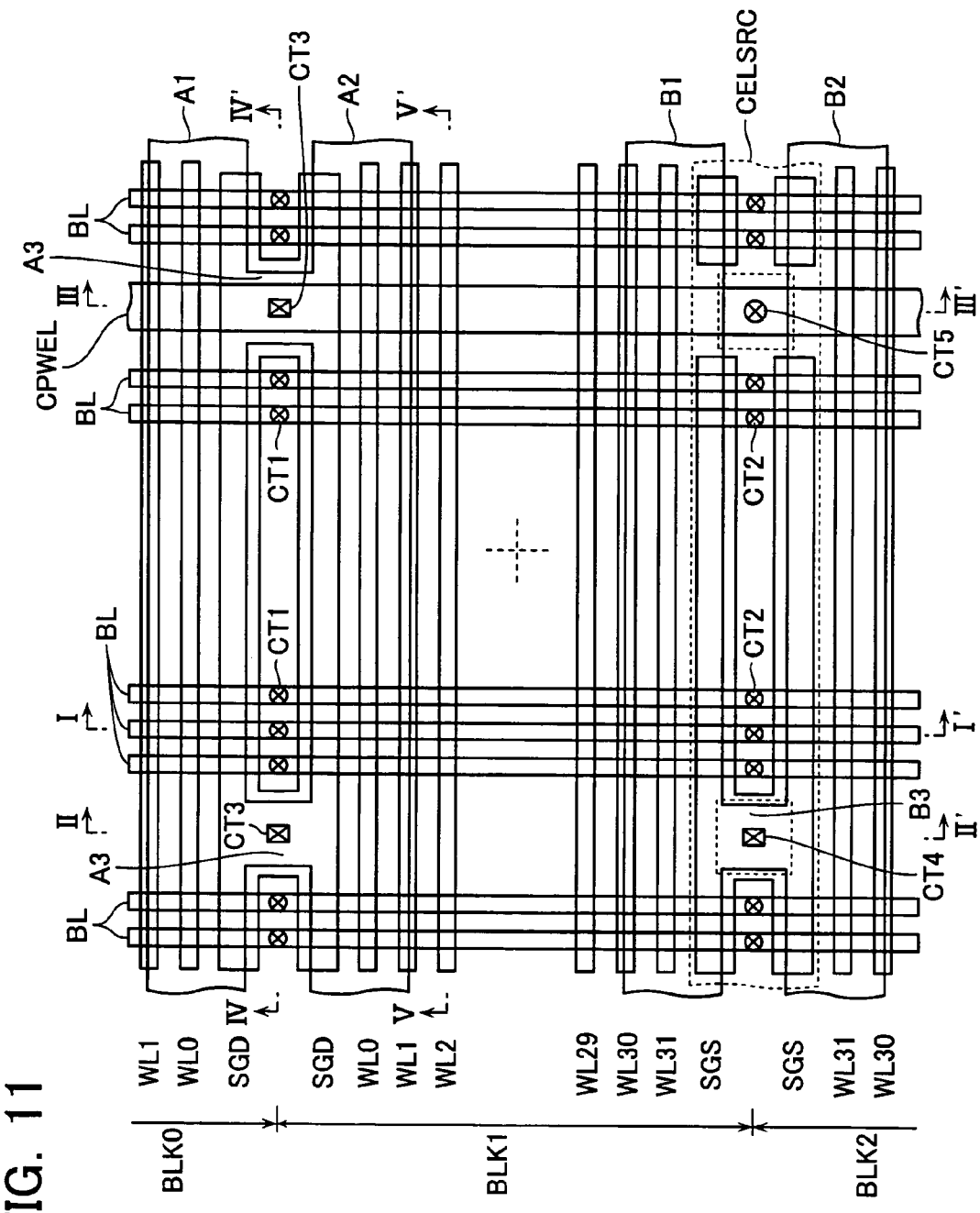
FIG. 11 shows the cell array layout of a NAND-type flash memory in accordance with a third embodiment.
Figure 12:
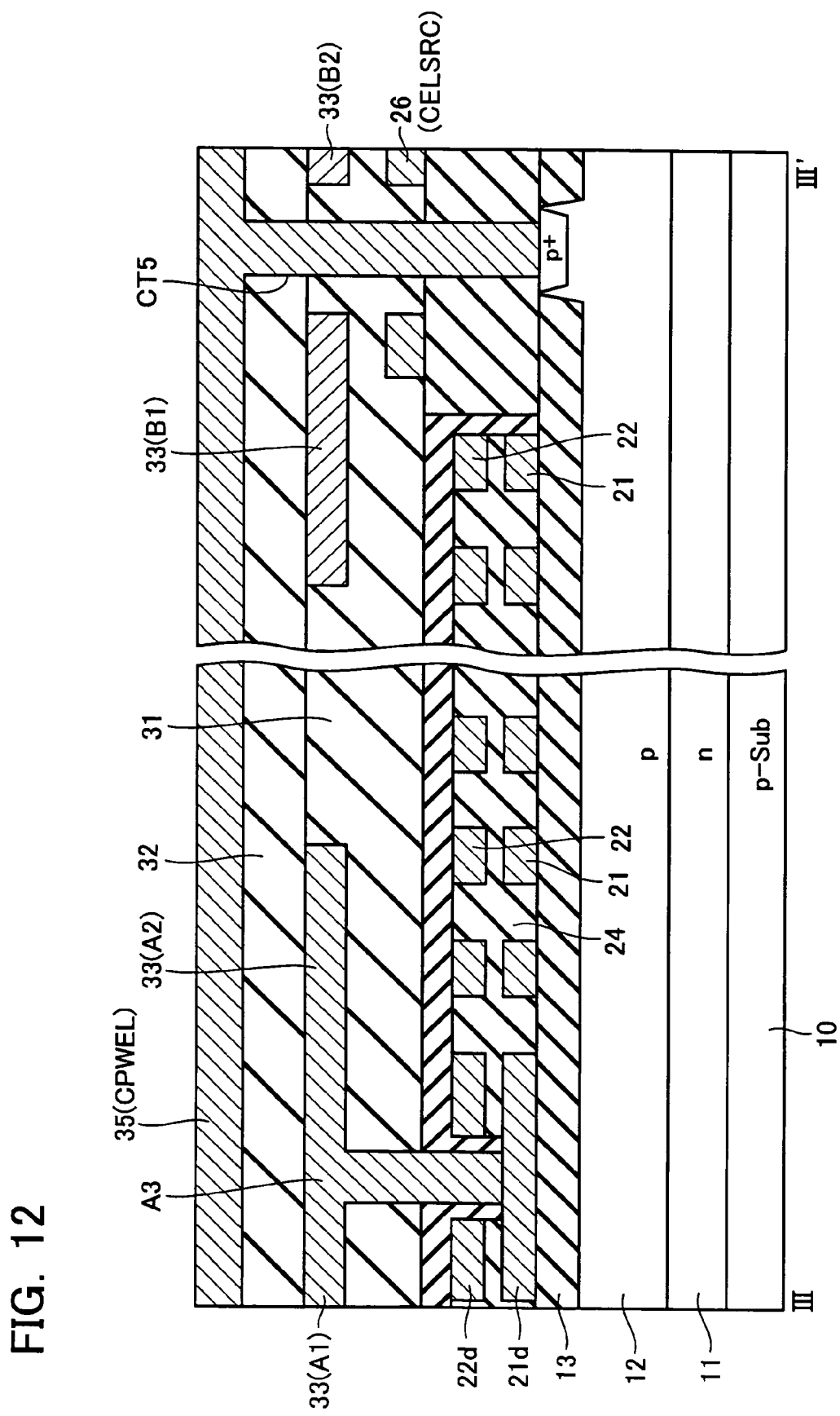
FIG. 12 shows a sectional view of the cell array taken along line III-III' in FIG. 11.
Figure 13:
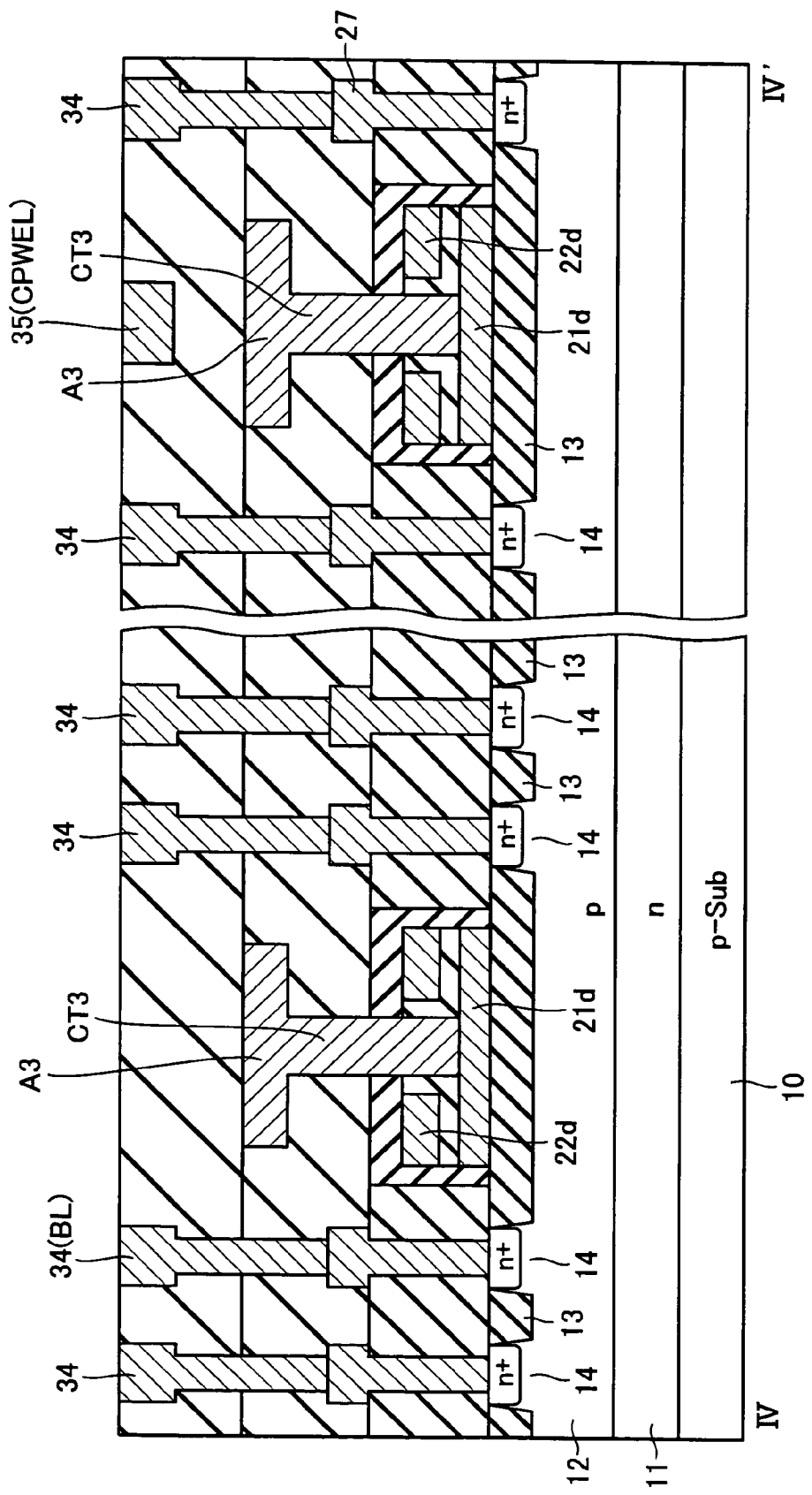
FIG. 13 shows a sectional view of the cell array taken along line IV-IV' in FIG. 11.

FIG. 11 shows a cell array layout of a NAND-type flash memory in accordance with a third embodiment. The same portions corresponding to those in the above-described embodiments are shown by the same reference signs, and detailed explanation thereof will be omitted. With respect to the sectional structures, III-III' and IV-IV' sectional views are shown in FIGS. 12 and 13, respectively, which show different sections from those in the first embodiment.

In this embodiment, the well wiring (CPWEL) 35 is, as similar to the first embodiment, contacted with the p-type well at the position where the source line contacts CT2 are arranged while connection portion A3 is deposited at the position, where the adjacent select gate lines SGD are coupled in common and the well wiring 35 passes though, and shunt wirings A1 and A2 are contacted with this.

According to this embodiment, the shunt numbers of the drain side select gate lines being made twice in comparison with the first embodiment, the delay time of the select gate line SGD may be shortened more.

Although there has not been explained in the above-described embodiments with respect to the inter-connection between two polysilicon films of the select gate lines SGD, SGS, the two polysilicon films are usually contacted with each other at a certain pitch as independent of the metal shunt wiring 33. Therefore, the shunt wiring 33 may be contacted with the second polysilicon film corresponding to the control gates in place of the first polysilicon film corresponding to the floating gates.

Figure 14:
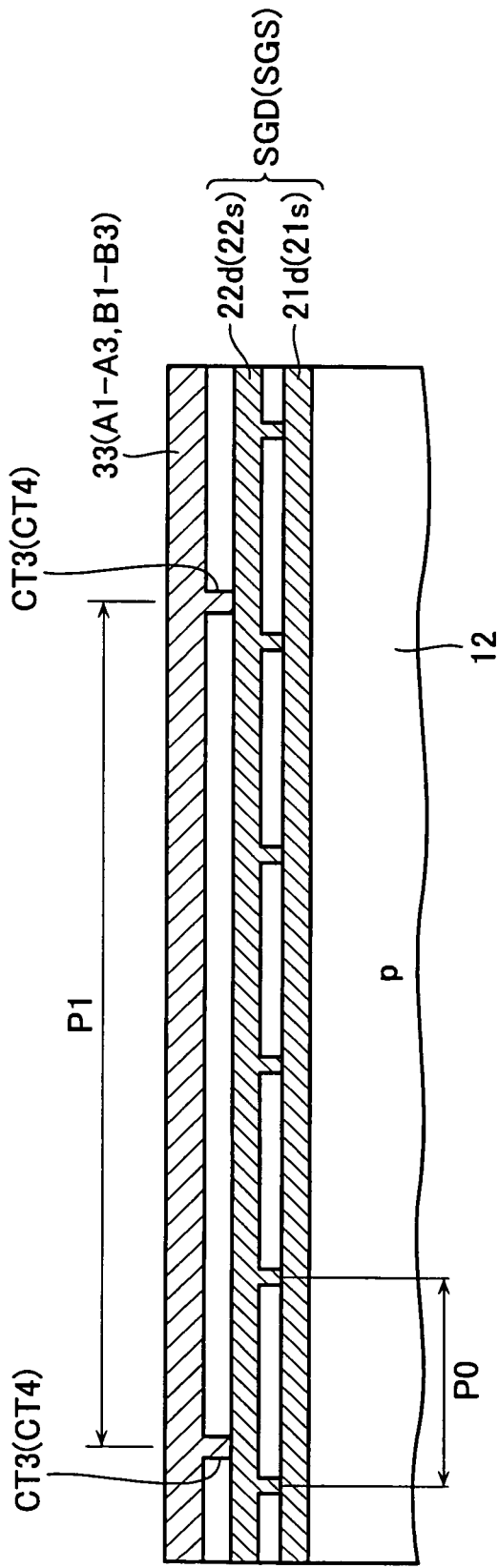
FIG. 14 shows another shunt wiring structure of the select gate line in accordance with another embodiment.

FIG. 14 shows a shunt wiring structure in accordance with another embodiment as described above. The two polysilicon films 21d and 22d (21s and 22s) constituting the select gate line SGD (SGS) are contacted with each other at a pitch P0, which corresponds, for example, one column (eight or sixteen bit lines) length. By contrast, the shunt wiring 33 may be, for example, contacted with the select gate line SGD (SGS) at a pitch P1 larger than the one column pitch P0.

Figure 15:
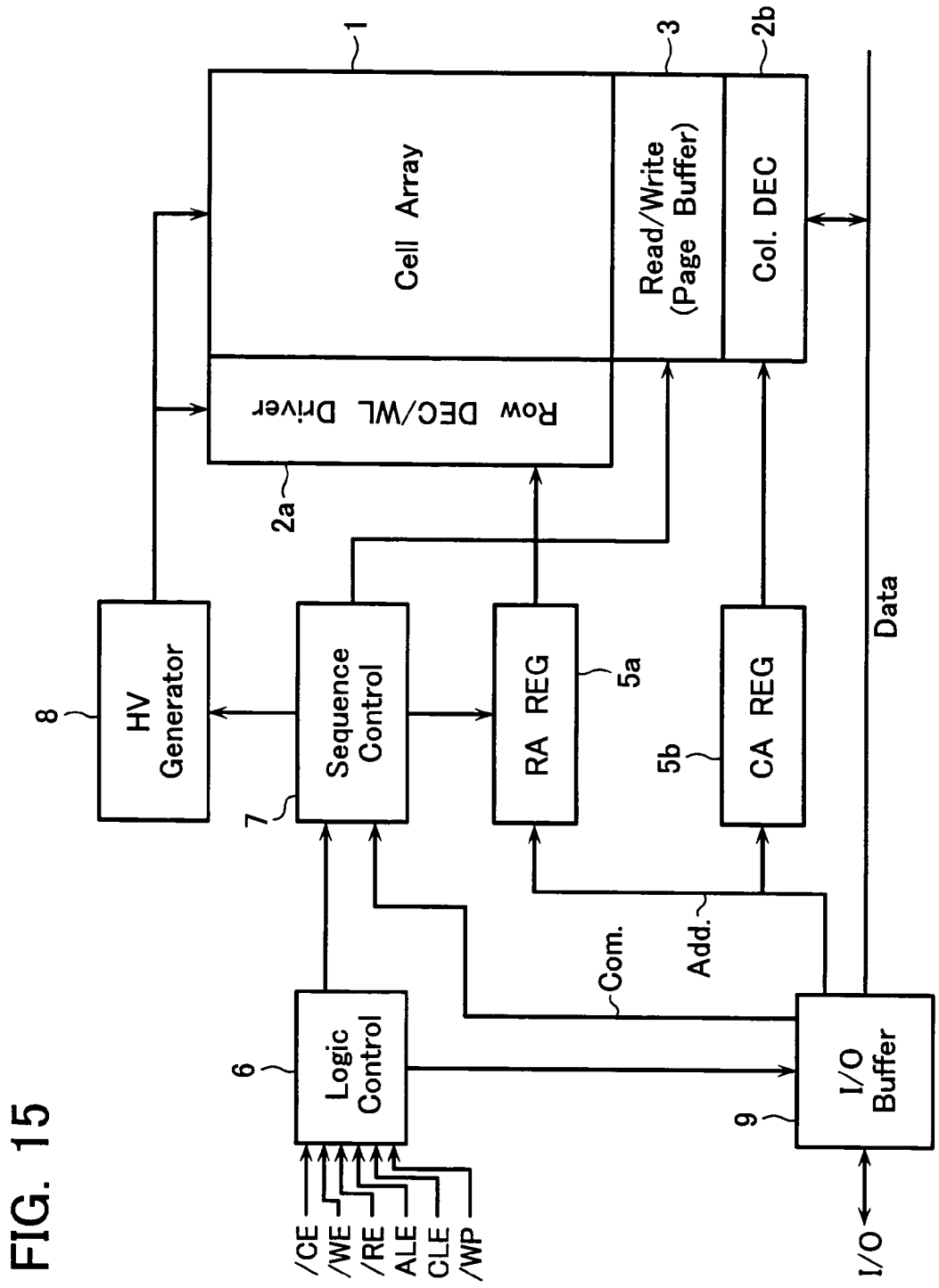
FIG. 15 shows a functional block configuration of the NAND-type flash memory in accordance with above-described embodiments.

Next, a functional block of the above-described NAND flash memories will be explained with reference to FIG. 15 below.

The memory cell array 1 is, as described above, configured to have a plurality of floating gate type memory cells as being arranged in a matrix manner. A row decoder/word line driver 2a is prepared to drive word lines and select gate lines of the memory cell array 1. A read/write circuit 3 serves as a page buffer with sense amplifier circuits and data hold circuits for one page, which is used for data reading and data writing for each one page of the memory cell array 1.

One page read data of the page buffer 3 is sequentially selected by a column decoder 2b to be output to external I/O terminals through an I/O buffer 9. Write data supplied from the I/O terminals are selected by the column decoder 2b to be loaded in the page buffer 3. In the page buffer 3, loaded are write data for one page.

Row and columns address signals are input through I/O buffer 9 to be transferred to row decoder 2a and column decoder 2b, respectively. Row address register 5a holds erase block address in an erase mode, and page address in read and write modes. Into column address register 5b, the head column address is input, which is used for write data loading prior to data write operation, or for data reading. Column address register 5b holds input column address until when write-enable signal /WE or read-enable signal /RE is toggled under a certain condition.

Logic controller 6 controls for command inputting, address inputting and data inputting/outputting in response to chip enable signal /CE, command latch enable signal CLE, address latch enable signal ALE, write enable signal /WE, read enable signal /RE and the like. Read and write operations are performed due to command. In response to command, a sequence controller 7 executes read control and sequence control of data write and data erase. A high voltage generator 8 is controlled by the controller 7 to output predetermined voltages necessary for many kinds of operations.

As an embodiment, an electric card using the non-volatile semiconductor memory devices according to the above-described embodiments and an electric device using the card will be described bellow.

Figure 16:
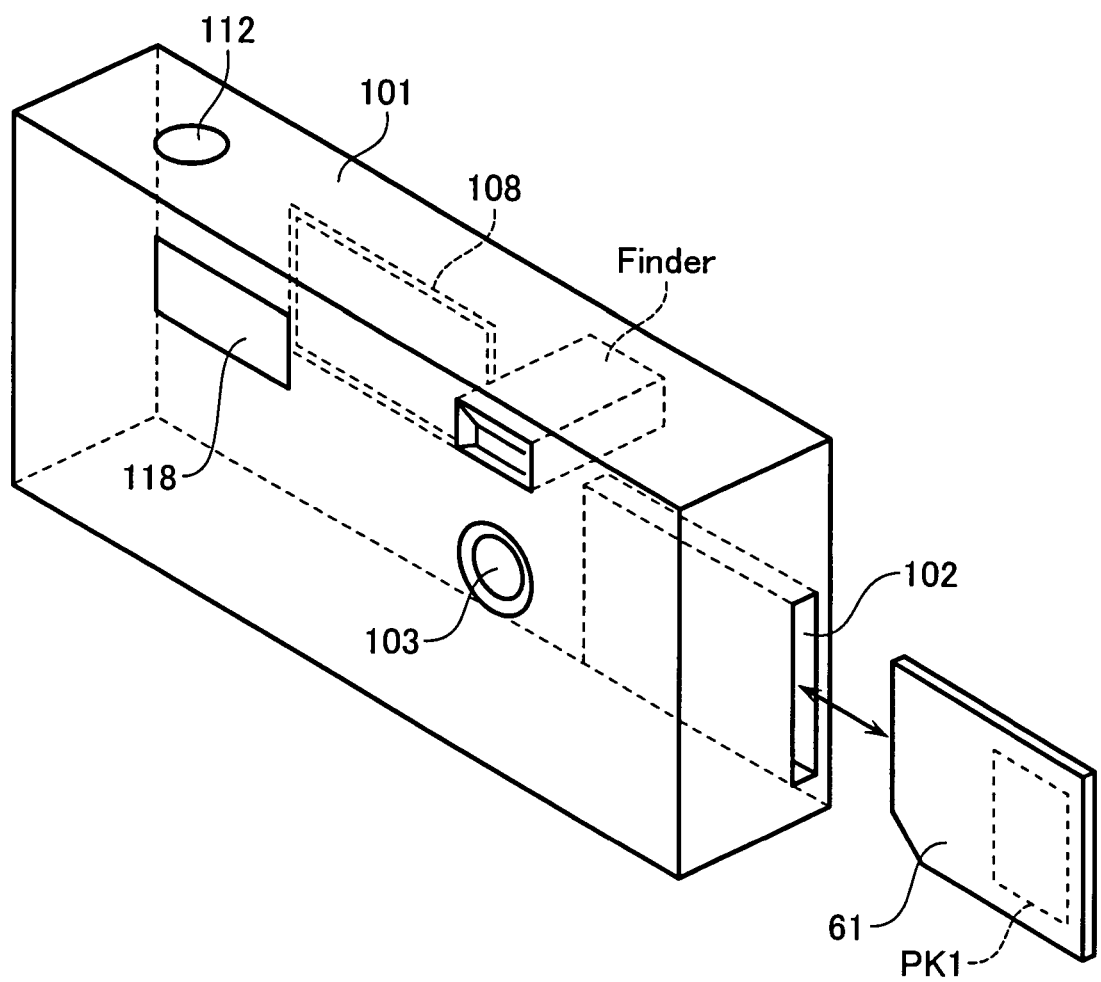
FIG. 16 shows another embodiment applied to a digital still camera.

FIG. 16 shows an electric card according to this embodiment and an arrangement of an electric device using this card. This electric device is a digital still camera 101 as an example of portable electric devices. The electric card is a memory card 61 used as a recording medium of the digital still camera 101. The memory card 61 incorporates an IC package PK1 in which the non-volatile semiconductor memory device or the memory system according to the above-described embodiments is integrated or encapsulated.

The case of the digital still camera 101 accommodates a card slot 102 and a circuit board (not shown) connected to this card slot 102. The memory card 61 is detachably inserted in the card slot 102 of the digital still camera 101. When inserted in the slot 102, the memory card 61 is electrically connected to electric circuits of the circuit board.

If this electric card is a non-contact type IC card, it is electrically connected to the electric circuits on the circuit board by radio signals when inserted in or approached to the card slot 102.

Figure 17:
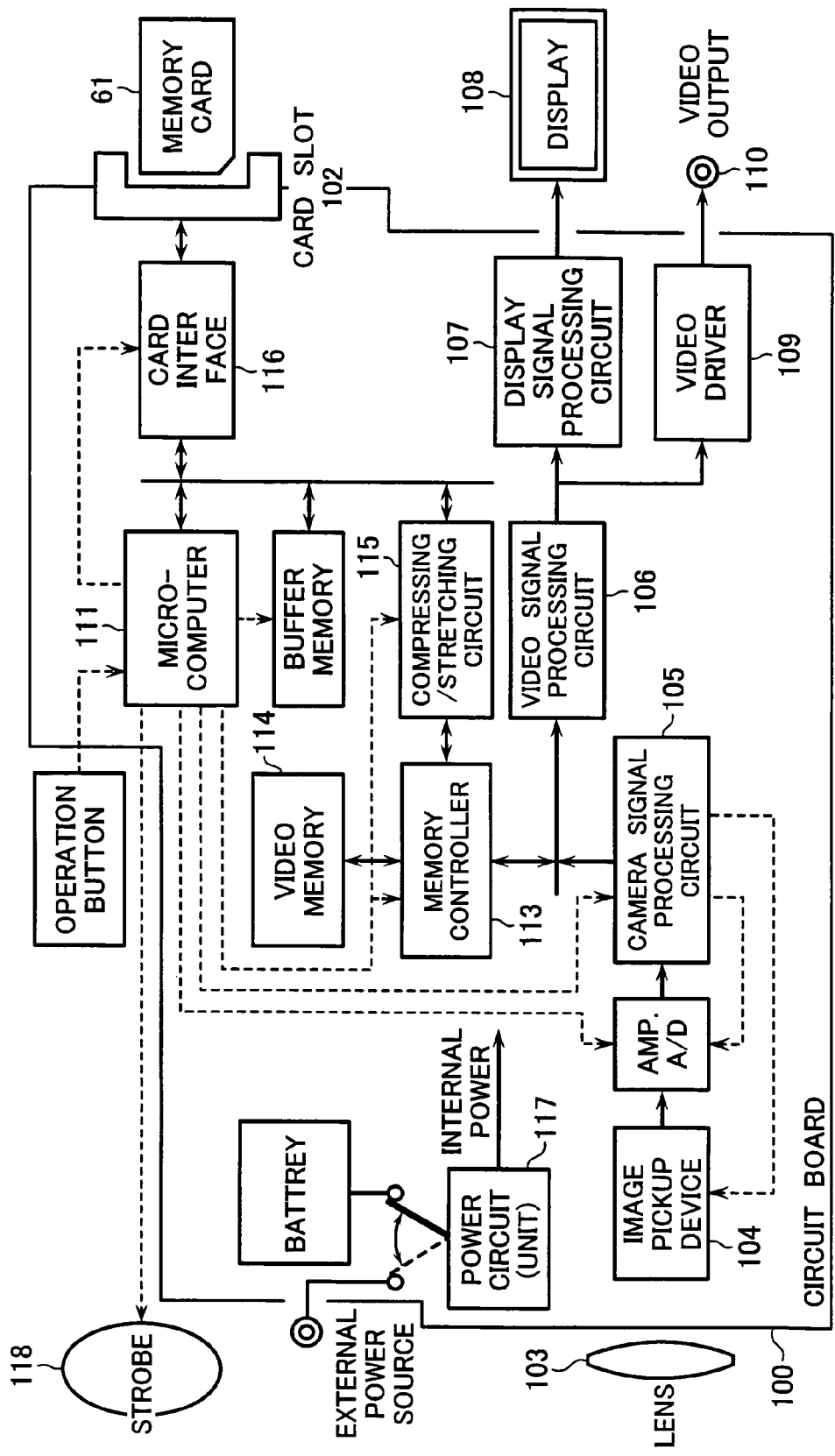
FIG. 17 shows the internal configuration of the digital still camera.
Figure 18A:
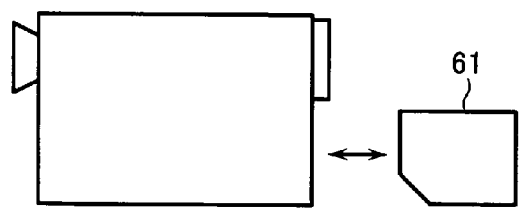
FIGS. 18A to 18J show other electric devices to which the embodiment is applied.
Figure 18F:
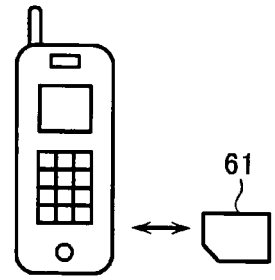
Figure 18B:
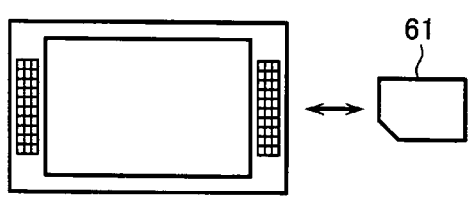
Figure 18G:
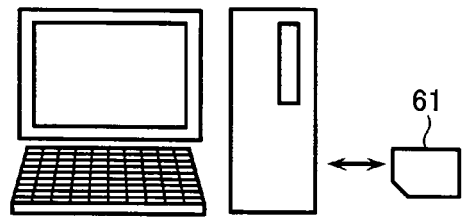
Figure 18C:
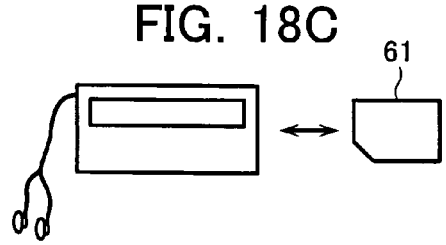
Figure 18H:
Figure 18D:
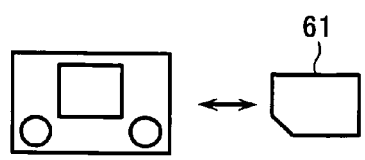
Figure 18I:
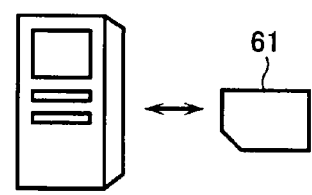
Figure 18E:
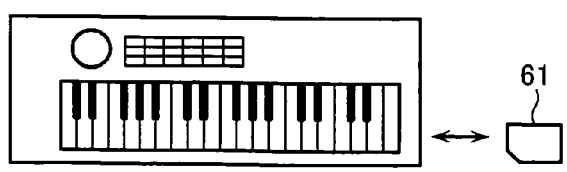
Figure 18J:
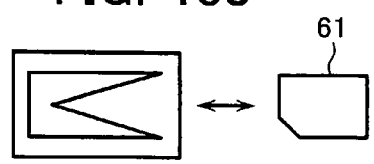

FIG. 17 shows a basic arrangement of the digital still camera. Light from an object is converged by a lens 103 and input to an image pickup device 104. The image pickup device 104 is, for example, a CMOS sensor and photoelectrically converts the input light to output, for example, an analog signal. This analog signal is amplified by an analog amplifier (AMP), and converted into a digital signal by an A/D converter (A/D). The converted signal is input to a camera signal processing circuit 105 where the signal is subjected to automatic exposure control (AE), automatic white balance control (AWB), color separation, and the like, and converted into a luminance signal and color difference signals.

To monitor the image, the output signal from the camera processing circuit 105 is input to a video signal processing circuit 106 and converted into a video signal. The system of the video signal is, e.g., NTSC (National Television System Committee). The video signal is input to a display 108 attached to the digital still camera 101 via a display signal processing circuit 107. The display 108 is, e.g., a liquid crystal monitor.

The video signal is supplied to a video output terminal 110 via a video driver 109. An image picked up by the digital still camera 101 can be output to an image apparatus such as a television set via the video output terminal 110. This allows the pickup image to be displayed on an image apparatus other than the display 108. A microcomputer 111 controls the image pickup device 104, analog amplifier (AMP), A/D converter (A/D), and camera signal processing circuit 105.

To capture an image, an operator presses an operation button such as a shutter button 112. In response to this, the microcomputer 111 controls a memory controller 113 to write the output signal from the camera signal processing circuit 105 into a video memory 114 as a flame image. The flame image written in the video memory 114 is compressed on the basis of a predetermined compression format by a compressing/stretching circuit 115. The compressed image is recorded, via a card interface 116, on the memory card 61 inserted in the card slot.

To reproduce a recorded image, an image recorded on the memory card 61 is read out via the card interface 116, stretched by the compressing/stretching circuit 115, and written into the video memory 114. The written image is input to the video signal processing circuit 106 and displayed on the display 108 or another image apparatus in the same manner as when image is monitored.

In this arrangement, mounted on the circuit board 100 are the card slot 102, image pickup device 104, analog amplifier (AMP), A/D converter (A/D), camera signal processing circuit 105, video signal processing circuit 106, display signal processing circuit 107, video driver 109, microcomputer 111, memory controller 113, video memory 114, compressing/stretching circuit 115, and card interface 116.

The card slot 102 need not be mounted on the circuit board 100, and can also be connected to the circuit board 100 by a connector cable or the like.

A power circuit 117 is also mounted on the circuit board 100. The power circuit 117 receives power from an external power source or battery and generates an internal power source voltage used inside the digital still camera 101. For example, a DC-DC converter can be used as the power circuit 117. The internal power source voltage is supplied to the respective circuits described above, and to a strobe 118 and the display 108.

As described above, the electric card according to this embodiment can be used in portable electric devices such as the digital still camera explained above. However, the electric card can also be used in various apparatus such as shown in FIGS. 18A to 18J, as well as in portable electric devices. That is, the electric card can also be used in a video camera shown in FIG. 18A, a television set shown in FIG. 18B, an audio apparatus shown in FIG. 18C, a game apparatus shown in FIG. 18D, an electric musical instrument shown in FIG. 18E, a cell phone shown in FIG. 18F, a personal computer shown in FIG. 18G, a personal digital assistant (PDA) shown in FIG. 18H, a voice recorder shown in FIG. 18I, and a PC card shown in FIG. 18J.

This invention is not limited to the above-described embodiment. It will be understood by those skilled in the art that various changes in form and detail may be made without departing from the spirit, scope, and teaching of the invention.

What is claimed is:

1. A semiconductor memory device comprising:
   a semiconductor substrate;
   a cell array formed on the semiconductor substrate with NAND cell units arranged therein, the NAND cell unit having plural non-volatile semiconductor memory cells connected in series and first and second select gate transistors disposed at both ends thereof, one block including a set of the NAND cell units arranged in a first direction, a plurality of the blocks being arranged in a second direction in such a manner that common drains of the first select gate transistors in adjacent blocks serve as bit line contacts while common sources of the second select gate transistors in the following adjacent blocks serve as source line contacts;
   word lines formed as elongated in the first direction of the cell array, to which control gates of a plurality of the memory cells arranged in the first direction are coupled in common;
   first select gate lines formed as elongated in the first direction of the cell array, to which gates of a plurality of the first select gate transistors arranged in the first direction are coupled in common;
   second select gate lines formed as elongated in the first direction of the cell array, to which gates of a plurality of the second select gate transistors arranged in the first direction are coupled in common; and
   first and second shunt wirings formed above the first and second select gate lines, respectively, wherein
   two first select gate lines in adjacent blocks sandwiching the bit line contacts are formed to have first connection portions disposed at a certain pitch, the two first select gate lines being connected to each other at the first connection portions;
   two second select gate lines in adjacent blocks sandwiching the source line contacts are formed to have second connection portions disposed at substantially the same pitch as the first connection portions, the two second select gate lines being connected to each other at the second connection portions; and
   the first and second shunt wirings are contacted with the first and second select gate lines at the first and second connection portions, respectively.

2. The semiconductor memory device according to claim 1, further comprising:
   bit lines continued in the second direction to extend over plural blocks and connected to the common drains of the first select gate transistors;
   a source line, to which the common source of the second select gate transistors are connected in common; and
   a well wiring formed to be continued in the second direction and contacted with the semiconductor substrate at a location of at least one of the first and second select gate lines.

3. The semiconductor memory device according to claim 2, wherein
   the well wiring has a contact portion where the well wiring is contacted with the semicunductor substrate, the contact portion being disposed midway between the second connection portions of the second select gate lines, which are discontinued at the contact portion.

4. The semiconductor memory device according to claim 3, wherein
   the first connection portions of the first select gate lines are further disposed at the location, where the well wiring passes through, so that the first connection portions are arranged at a half pitch of the second connection portions of the second select gate lines.

5. The semiconductor memory device according to claim 2, wherein
   the well wiring has first and second contact portions, where the well wiring is contacted with the semiconductor substrate, which are disposed midway between the first connection portions of the first select gate lines and between the second connection portions of the second select gate lines, and the first and second select gate lines are discontinued at the first and second contact portions, respectively.

6. The semiconductor memory device according to claim 2, wherein
   the first and second shunt wirings are formed of a first metal layer formed on a first interlayer insulating film, which covers the cell array;
   the bit lines are formed of a second metal layer formed on a second interlayer insulating film, which covers the first metal layer; and
   the well wiring is formed of the second metal layer or another upper metal layer.

7. The semiconductor memory device according to claim 1, wherein
   each memory cell has a floating gate formed of a first polysilicon film and a control gate formed of a second polysilicon film stacked thereabove, control gates of the memory cell arranged in the first direction being formed as a word line.

8. The semiconductor memory device according to claim 7, wherein
   the first and second select gate lines are formed of a stacked film of the first and second polysilicon films.

9. The semiconductor memory device according to claim 8, wherein
   the stacked film of the first and second select gate lines are interconnected to each other at a pitch smaller than a pitch of the first and second connection portions.

10. The semiconductor memory device according to claim 7, wherein
    a source line contacted with the common source of the second select gate transistors is formed of a third polysilicon film, and
    contact plugs formed of the third polysilicon film are buried at the bit line contact portions.

11. A semiconductor memory device comprising:
    a semiconductor substrate;
    a cell array formed on the substrate with NAND cell units arranged therein, the NAND cell unit having plural non-volatile semiconductor memory cells connected in series and first and second select gate transistors disposed at both ends thereof, the cell array including at least three, first, second and third blocks arranged in a first direction, each block including a set of the NAND cell units arranged in a second direction;
    bit lines formed to be continued in the first direction of the cell array and contacted with common drains of the first select gate transistors in the first and second blocks at bit line contact portions disposed and arranged between the first and second blocks;
    a common source line contacted with common sources of the second select gate transistors in the second and third blocks at source line contact portion disposed and arranged between the second and third blocks;
    word lines formed to be continued in the second direction in the cell array, to which control gates of a plurality of the memory cells are coupled in common;

first select gate lines formed in parallel with the word lines in the cell array, to which gates of a plurality of the first select gate transistors are coupled in common;

second select gate lines formed in parallel with the word lines in cell array, to which gates of a plurality of the second select gate transistors are coupled in common;

first and second shunt wirings formed above the first and second select gate lines, respectively; and a well wiring formed to be continued in the first direction and contacted with the semiconductor substrate at a well wiring contact portion disposed in line with at least one of the bit line contact portions and the source line contact portions, wherein two of the first select gate lines, which are disposed adjacent to each other to sandwich the bit line contact portions, are formed to constitute a ladder pattern with first interconnection portions arranged at a first pitch;

two of the second select gate lines, which are disposed adjacent to each other to sandwich the source line contact portions, are formed to constitute another ladder pattern with second interconnection portions arranged at a second pitch; and the first and second shunt wirings are contacted with the first and second select gate lines at the first and second interconnection portions, respectively.

12. The semiconductor memory device according to claim 11, wherein the well wiring contact portion is disposed midway between the second interconnection portions of the second select gate lines, and the second select gate lines are discontinued at the well wiring contact portion.

13. The semiconductor memory device according to claim 12, wherein the first interconnection portions of the first select gate lines are further disposed at the location where the well wiring passes through, so that the first pitch is set to be half of the second pitch.

14. The semiconductor memory device according to claim 11, wherein the well wiring has first and second well wiring contact portions disposed in line with the bit line contact portions and the source line contact portions, respectively, the first and second well wiring contact portions being disposed midway between the first interconnection portions of the first select gate lines and midway between the second interconnection portions of the second select gate lines, respectively, and the first and second select gate lines are discontinued at the first and second well wiring contact portions, respectively.

15. The semiconductor memory device according to claim 11, wherein the first and second shunt wirings are formed of a first metal layer formed on a first interlayer insulating film, which covers the cell array;

the bit lines are formed of a second metal layer formed on a second interlayer insulating film, which covers the shunt wirings; and the well wiring is formed of the second metal layer or another upper metal layer.

16. The semiconductor memory device according to claim 11, wherein the first and second pitches are set to be equal to each other.

17. The semiconductor memory device according to claim 11, wherein each memory cell has a floating gate formed of a first polysilicon film and a control gate formed of a second polysilicon film stacked thereabove, control gates of the memory cell arranged in the first direction are formed to be a word line.

18. The semiconductor memory device according to claim 17, wherein the first and second select gate lines are formed of a stacked film of the first and second polysilicon films.

19. The semiconductor memory device according to claim 18, wherein the stacked film of the first and second select gate lines are interconnected to each other at a pitch smaller than the first and second pitches.

20. The semiconductor memory device according to claim 17, wherein the common source line is formed of a third polysilicon film, and contact plugs formed of the third polysilicon film are buried at the bit line contact portions.

* * * * *

UNITED STATES PATENT AND TRADEMARK OFFICE
CERTIFICATE OF CORRECTION

PATENT NO. : 7,489,010 B2  Page 1 of 1
APPLICATION NO. : 11/409043
DATED : February 10, 2009
INVENTOR(S) : Takeuchi It is certified that error appears in the above-identified patent and that said Letters Patent is hereby corrected as shown below:

On the title page, Item (54), and Column 1, the title information is incorrect. Item (54) and Column 1 should read:

-- (54) NAND-TYPE EEPROM HAVING SELECT GATE LINES IN ADJACENT MEMORY BLOCKS SANDWICHING BIT LINE CONTACTS AND HAVING CONNECTION PORTIONS DISPOSED AT CERTAIN PITCH --

Signed and Sealed this

Thirty-first Day of March, 2009

JOHN DOLL
*Acting Director of the United States Patent and Trademark Office*